US006605935B2

(12) United States Patent
Nilsson (10) Patent No.: US 6,605,935 B2
(45) Date of Patent: Aug. 12, 2003

(54) LINEAR FAST-LOCKING DIGITAL PHASE DETECTOR

(75) Inventor: Magnus Nilsson, Lund (SE)

(73) Assignee: Telefonaktiebolaget L M Ericsson (PUBL), Stockholm (SE)

( * ) Notice: Subject to any disclaimer, the term of this patent is extended or adjusted under 35 U.S.C. 154(b) by 0 days.

(21) Appl. No.: 09/973,820

(22) Filed: Oct. 11, 2001

(65) Prior Publication Data

US 2002/0163325 A1 Nov. 7, 2002

Related U.S. Application Data (60) Provisional application No. 60/278,667, filed on Mar. 21, 2001.

(51) Int. Cl.[7] .............................................. G01R 23/12
(52) U.S. Cl. ................................................... 324/76.53
(58) Field of Search ........................ 324/76.53, 76.77, 324/76.52, 76.68, 76.41, 91, 76.39, 76.51; 331/1, 27; 327/2

(56) References Cited

U.S. PATENT DOCUMENTS

| 5,095,287 A | * | 3/1992 | Irwin et al. ................. 331/1 A |
| 5,631,582 A |   | 5/1997 | Fujikawa |
| 6,002,273 A |   | 12/1999 | Humphreys |
| 6,049,233 A | * | 4/2000 | Shurboff ........................ 327/2 |
| 6,198,355 B1 | * | 3/2001 | Lindquist et al. ............. 331/27 |
| 6,448,755 B1 | * | 9/2002 | Opsahl ..................... 324/76.53 |

FOREIGN PATENT DOCUMENTS

| EP | 0458269 A1 | 11/1997 |
| WO | 0410029 A1 | 1/1991 |

OTHER PUBLICATIONS

D. P. Turner, "Phase–Locked Loop Phase Adjustment", IBM Technical Disclosure Bulletin, vol. 15, No. 7, Dec. 1972, pp. 2080–2081.

* cited by examiner

Primary Examiner—N. Le
Assistant Examiner—Donald M Lair
(74) Attorney, Agent, or Firm—Burns, Doane, Swecker & Mathis, L.L.P.

(57) ABSTRACT

A fast-locking phase detector includes a first input that receives a first signal, a second input that receives a second signal, and a comparison circuit that generates an output current in proportion to a phase difference between the first signal and the second signal. An operating point circuit selectively maintains a first operating point of the phase detector when a phase of the first signal leads a phase of the second signal, and maintains a second operating point of the phase detector when the phase of the first signal lags the phase of the second signal. The first and second operating points are different from one another. Each of the first and second operating points causes the output current to vary substantially linearly for a predetermined range of both positive and negative phase differences between the first signal and the second signal.

4 Claims, 11 Drawing Sheets

LINEAR FAST-LOCKING DIGITAL PHASE DETECTOR

CROSS REFERENCE TO RELATED APPLICATIONS

This application claims the benefit of U.S. Provisional Application No. 60/278,667, filed Mar. 21, 2001, which is hereby incorporated herein by reference in its entirety.

BACKGROUND

The invention relates to fractional-N phase locked loops, more particularly to Sigma-Delta controlled fractional-N phase locked loop modulators used for generating continuous phase modulation, and still more particularly to techniques for eliminating nonlinearities in PLL operation.

Phase locked loops (PLLs) are well known, and are useful for generating oscillating signals in many types of circuits, including but not limited to radio circuitry. In digital communication systems, for example in mobile telephone communications operating under the GSM or DCS systems, PLLs may be employed to effect continuous phase modulation (CPM) of a carrier signal.

Figure 1:
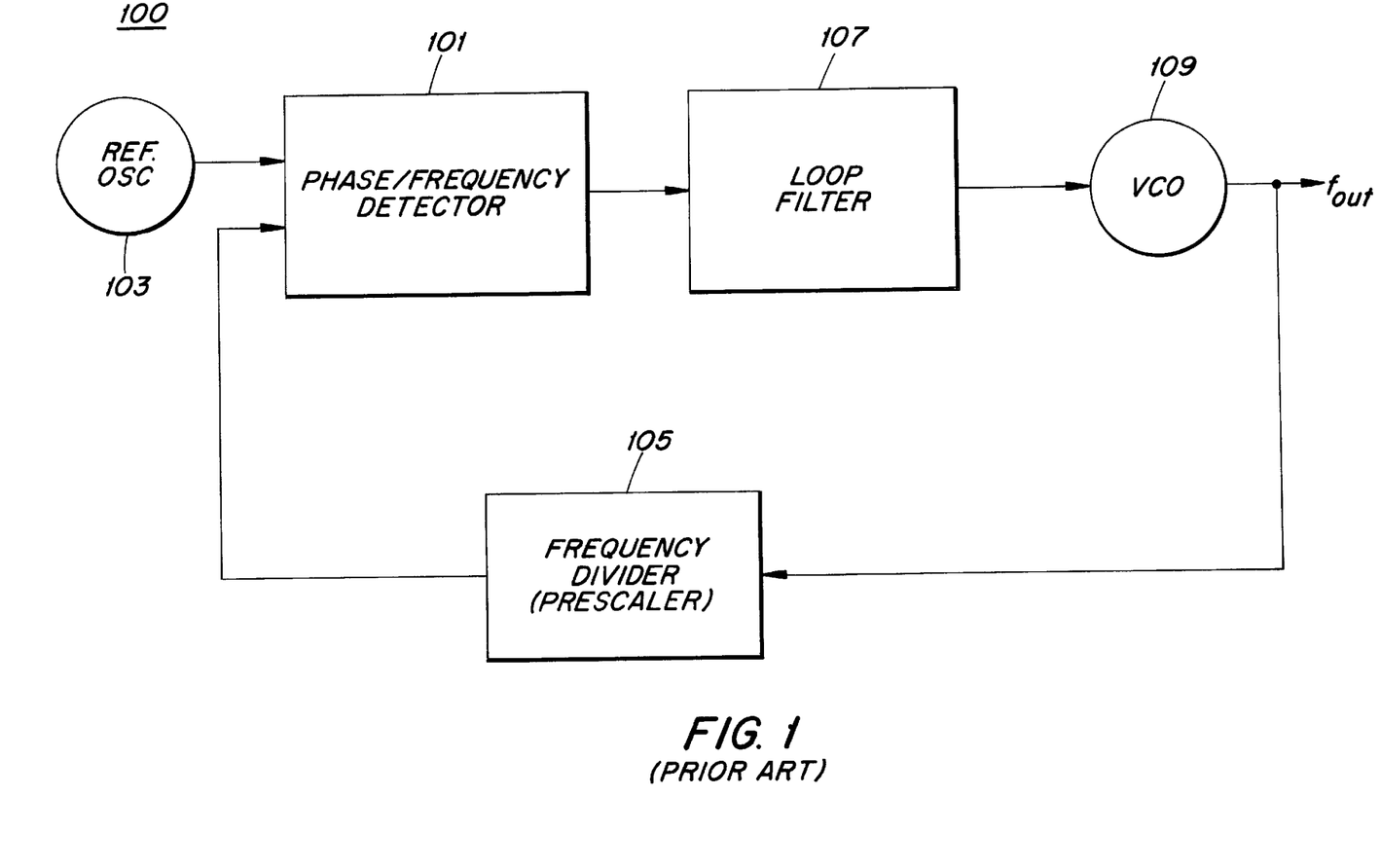
FIG. 1 is a block diagram of a conventional integer-divide phase-locked loop.

FIG. 1 is a block diagram of a conventional integer-divide PLL 100. A phase (frequency) detector 101 compares the phase of a signal supplied by a reference oscillator 103 with the phase of a feedback signal supplied by a frequency divider 105. The output of the phase detector, which represents the phase difference between the two input signals, is filtered by a filter 107. The filtered output is then used to control the frequency of an output signal generated by a voltage controlled oscillator (VCO) 109. The output signal from the VCO 109, in addition to being supplied as an output from the PLL, is also supplied as an input to the frequency divider 105, and is thus the source of the feedback source. The PLL 100 is governed by the following equations:

$$i_e = K_P\left(\varphi_R - \frac{\varphi_o}{N}\right) \quad (1)$$

$$\varphi_o = i_e Z(s)\frac{K_V}{s},$$

where s, $K_p$, $Z(s)$, and $K_V$ are the complex frequency, phase detector gain, loop-filter trans-impedance, and VCO gain, respectively, and $\phi_R$, $\phi_o$, and $i_e$, are the reference phase (or frequency as $2\pi f = s^*\phi$), the VCO phase, and the phase-detector error current, respectively.

Solving the above equations for $\phi_o$ yields the well-known result that $f_o = N \cdot f_R$, that is, the VCO frequency is an integer multiple of the reference frequency.

Since the loop response time to a change in N (e.g., when a new channel is selected) is proportional to $1/f_R$ (i.e., it takes a certain number of reference cycles to settle) and the minimum channel spacing equals $f_R$, there are conflicting considerations involved in the choice of reference frequency. That is, it would be desirable to set a low value for $f_R$ to reduce the minimum channel spacing. However, such a setting would result in a larger loop response time, which is undesirable.

To get around the above restriction on channel spacing, fractional-N PLLs have been devised. By employing a variable-modulus divider, rather than an integer divider, it is possible to achieve more flexible divide ratios. For example, performing three successive divisions by 20 followed by one division by 21 results in an average division factor of $(3 \cdot 20 + 21)/4 = 20.25$ and a channel spacing of $f_R/4$. Due to the repetitive nature of this variable modulus division, however, spurious tones will be generated (here at $f_o \pm n \cdot f_R$) that will modulate the VCO.

To address these problems, $\Sigma\Delta$ modulators have been employed to shape the spurious response of the fractional-N divider. If one examines a typical $\Sigma\Delta$ noise density distribution, it can be seen that the spurious tone is replaced by a spectrum of spurious tones with most of the spurious energy being pushed out in frequency, well beyond the bandwidth of the PLL, essentially being centered around $f_R/2$, where $f_r$ is the clocking rate of the $\Sigma\Delta$ modulator. A thermal noise floor (e.g., thermal noise attributable to the divider circuitry) is also included. As a result of the shaping performed by the $\Sigma\Delta$ modulator, this spurious energy will have a substantially reduced effect on the output signal from the PLL.

$\Sigma\Delta$-controlled fractional-N PLLs are often used in radio systems for generating spurious-free local oscillator frequencies and to allow faster frequency jumps. By controlling the divider ratio with a Sigma-Delta modulator, modulation with a constant envelope can be generated. By using these properties of the fractional-N PLL, compact radio architectures for constant envelope systems (e.g., GSM, DCS) can be developed. This also means that the complete radio can be integrated in the same ASIC.

Figure 2:
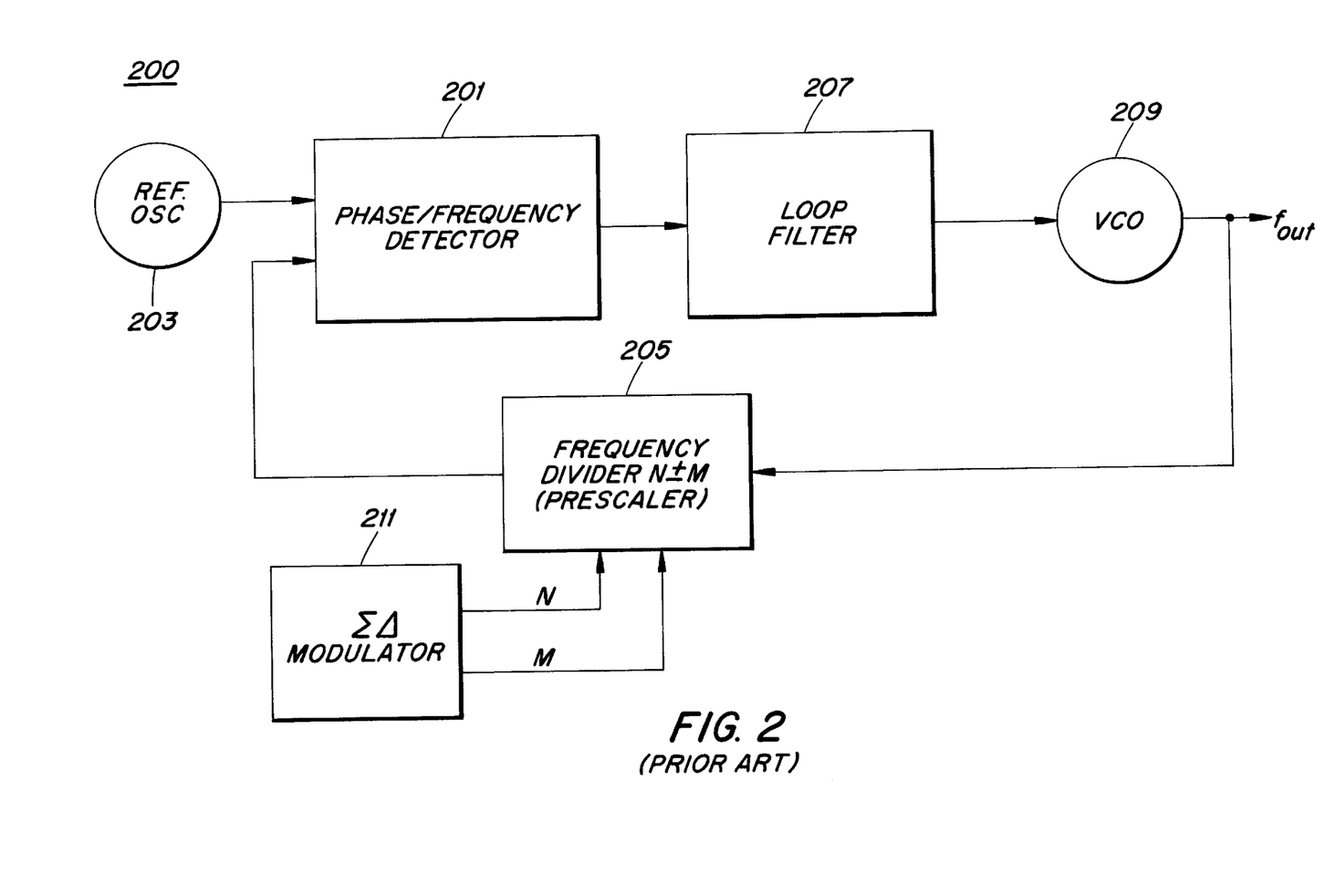
FIG. 2 is a block diagram of an exemplary embodiment of a $\Sigma\Delta$ fractional-N PLL.

An exemplary embodiment of a $\Sigma\Delta$ fractional-N PLL 200 is depicted in FIG. 2. The phase detector 201, reference oscillator 203, filter 207 and VCO 209 are analogous to those counterpart elements described with respect to FIG. 1, and therefore need not be described here in detail. The frequency divider 205 in this case is capable of dividing by any integer modulus in the range N±M, and has two inputs: one for receiving a value for N, and another for receiving a value of M. By appropriately varying the value of M as described above, an effective division modulus of N+δN can be achieved. A $\Sigma\Delta$ modulator 211 is provided that receives a desired channel value, and generates therefrom appropriate values for N and M. A first-order $\Sigma\Delta$ modulator may be used, but this is not essential; higher-order $\Sigma\Delta$ modulators may be used in alternative embodiments.

The $\Sigma\Delta$ noise will be suppressed by the loop response (i.e., if the loop bandwidth is not too wide), but to avoid spurious tones due to $\Sigma\Delta$-modulator limit cycles (i.e., a repetitive behavior associated with having a period time that is too short), extra noise ("dither") is typically added to the $\Sigma\Delta$ noise in order to further randomize the $\Sigma\Delta$ noise. The resultant value is then quantized, which adds its own quantization noise, $e_q(k)$. The resultant value M, which is generated at the output of the $\Sigma\Delta$ modulator 211, is supplied to one of the modulus inputs of the frequency divider 205.

To make the noise shaping possible, the divider modulus should not be chosen to be only the two closest integer factors, but should instead be varied between, for example, N−M, ..., N+M. This extra modulus range is required if noise is to be pushed out in frequency, away from the VCO carrier; otherwise, the loop filter will not be able to suppress the $\Sigma\Delta$ noise. As a consequence of this extended divider modulus range, the instantaneous phase error will be increased. The $\Sigma\Delta$-loop equations then become:

$$i_e = K_P\left(\varphi_R - \frac{\varphi_o}{N + \delta N} + N_{\Delta\Sigma}\right) \quad (2)$$

$$\varphi_o = i_e Z(s)\frac{K_V}{s},$$

where N+δN and $N_{\Sigma\Delta}$ represent the fractional division ratio and the $\Sigma\Delta$-modulator noise, respectively.

Figure 3:
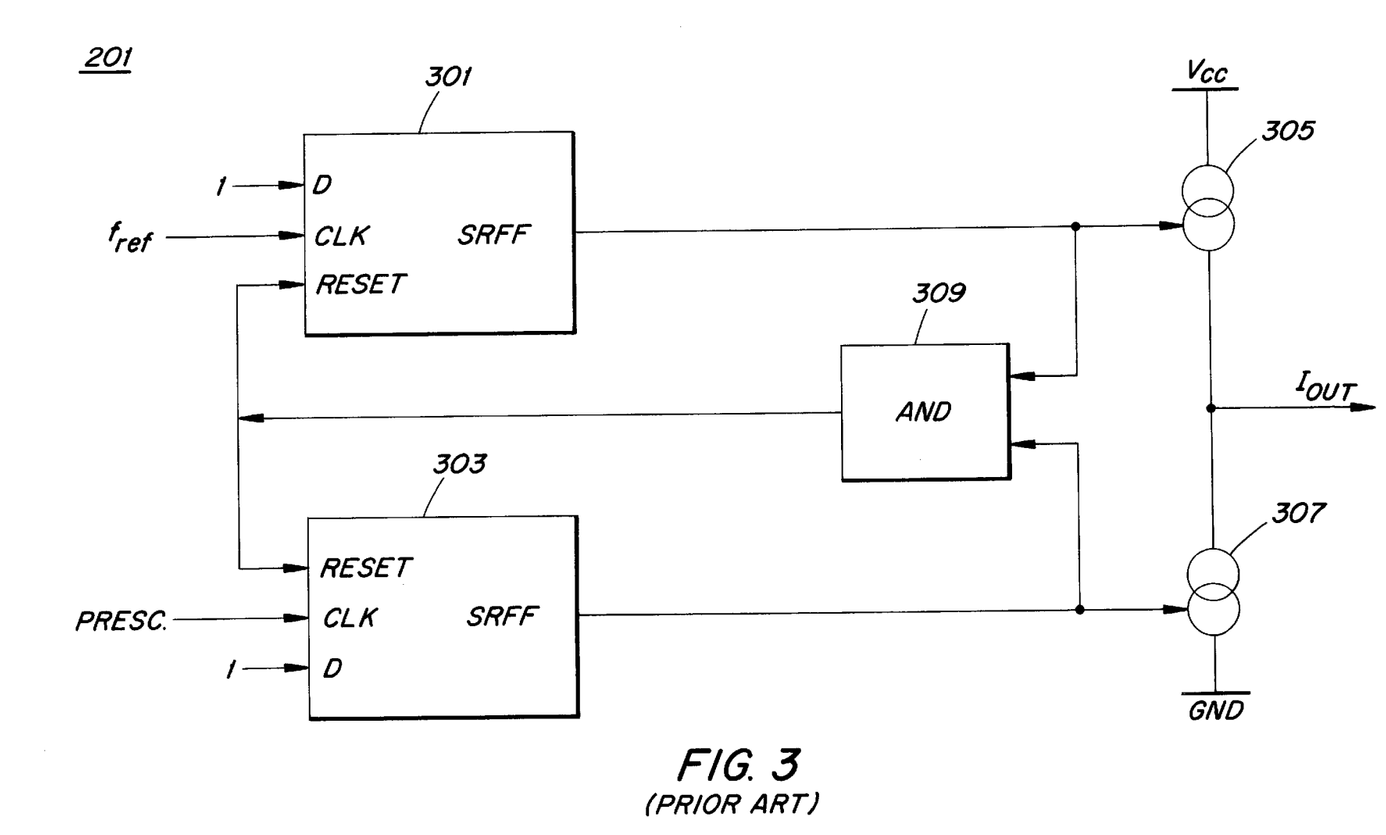
FIG. 3 is a block diagram of a typical embodiment of the conventional phase detector.

FIG. 3 is a block diagram of a typical embodiment of the conventional phase detector 201. The use of first and second digital latches 301, 303 enables multiple states (not shown in FIG. 3) and, hence, an extended range of the phase detector 201. In operation, the first latch 301 controls whether a first charge pump 305 is on or off. Similarly, the second latch 303 controls whether the second charge pump 307 is on or off. The first and second charge pumps 305, 307 are connected in series, with the phase detector output current, $I_{out}$, being supplied at the connection point between the two charge pumps. The amount of phase detector output current, $I_{out}$, is related to whether none, one, or both of the first and second charge pumps 305, 307 are turned on. The amount of time that $I_{out}$ is non-zero is a function of the phase difference between the first and second input signals, $f_{ref}$ and prescaler (Presc.). (The prescaler signal may also be referred to as a "feedback signal", when the phase detector 201 is used in a PLL.) Each of these signals is supplied to a clock input of a respective one of the first and second latches 301, 303. The first of these signals to present a clocking edge causes the output of the corresponding latch to be asserted, which in turn, causes a corresponding one of the first and second charge pumps 305, 307 to turn on. When the clocking edge of the remaining input signal is subsequently asserted, it too causes the output of its corresponding latch to be asserted. The outputs of both the first and second latches 301, 303 are further supplied to respective inputs of a logical AND gate 309, whose output is supplied to the RESET inputs of both the first and second latches 301, 303. Consequently, when the outputs of both latches 301, 303 are asserted, the output of the AND gate 309 will be asserted as well, thereby resetting both latches 301, 303. They are now initialized to repeat the process again for a next cycle. As a result, the output current $I_{out}$ is either a positive value (being supplied by the first charge pump 305) if the first input signal $f_{ref}$ leads the second input signal Presc., or else it is a negative value (being drawn by the second charge pump 307) if the second input signal Presc. leads the first input signal $f_{ref}$.

The phase detector output is often designed with charge pumps having a high-impedance off state. This high-impedance off state effectively turns the loop filter into an integrator (i.e., if the trans-impedance Z(s) is capacitive). A simplified rendition of the charge pump 305 can include a current mirror that supplies current when the "source" signal is asserted. A simplified rendition of the charge pump 307 can include a transistor that is turned on by the "sink" signal, so that it draws current when the "sink" signal is asserted.

Referring back to FIGS. 2 and 3, when the PLL 201 is properly tracking its reference, $f_{ref}$, both of the phase-detector latches 301, 303 trigger almost simultaneously, due to the fact that the phase difference between the two input signals becomes very small. The reset signal immediately resets the first and second latches 301, 303 and, as a consequence, only short spikes appear at the latch outputs, too fast to turn on the respective first and second charge pumps 305, 307.

Figure 4:
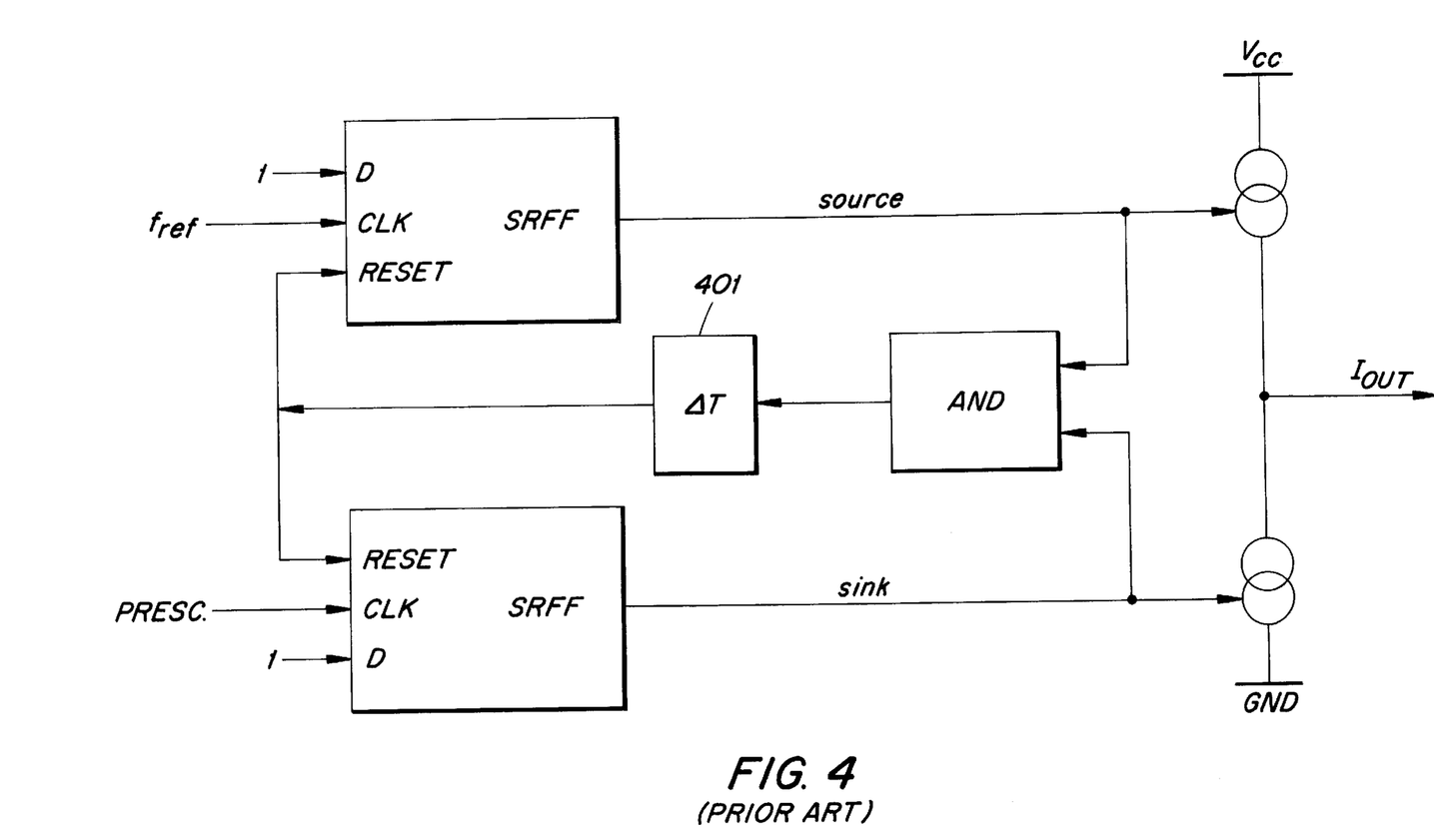
FIG. 4 is a block diagram of a conventional digital phase detector that uses a delay circuit to add a symmetric delay to the reset signal.

In fact, even when there is a small phase error (i.e., a tracking error), the first and second latches 301, 303 will reset too fast for the charge pumps 305, 307 to react. Consequently, the phase-detector transfer function will be characterized by a small dead-band (low-gain region) around the origin. A common technique to combat this dead-band is to utilize a delay circuit 401, which adds a delay ΔT to the reset signal, as illustrated in FIG. 4. With this extra delay, the up and down pulses will each be long enough to activate the charge pumps, thereby eliminating the dead-band.

Despite the use of the delay circuit 401 as described above, however, the ΣΔ-based fractional-N PLLs reported in the literature often have inferior noise performance compared to their integer-divide counterparts. This has prevented their use in demanding applications, like cellular phones. The origin of this excess noise has conventionally been attributed to the ΣΔ-modulator noise, even though the noise can be made to fall outside the loop bandwidth.

An additional problem when using a ΣΔ-based fractional-N PLL is that any nonlinearity in the analog implementation of the digital PLL will cause ΣΔ noise to be rectified and folded into the PLL bandwidth. The nonlinearity could be caused by charge pump nonlinearity, reference voltage ringing or substrate coupling.

Figure 5:
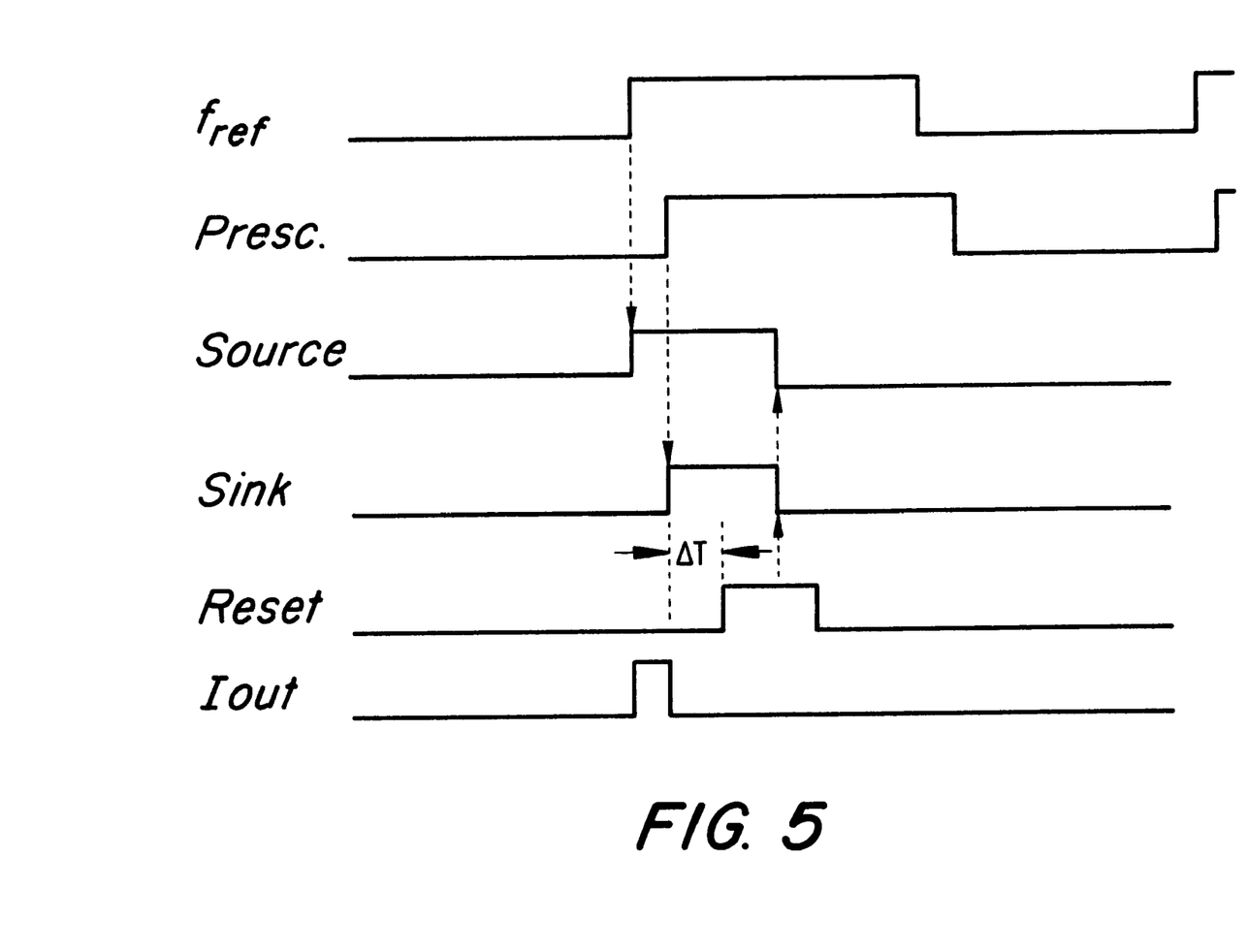
FIG. 5 is a timing diagram that illustrates typical signals in a $\Sigma\Delta$ fractional-N PLL that employs a phase detector such as the one depicted in FIG. 4 that are generated when a prescaler division ratio has increased from a nominal one.

FIG. 5 is a timing diagram that illustrates typical signals that are generated in a ΣΔ fractional-N PLL that employs a phase detector such as the one depicted in FIG. 4. The $f_{ref}$ and prescaler inputs control the source and sink currents, respectively. After a delay, ΔT, the reset signal is generated which turns off the current sources. In this example, the prescaler division ratio has increased from a nominal one. It can be seen that the rising edges of the source and sink currents are relatively close to one another, and that the source pulse is longer than the sink pulse.

Figure 6:
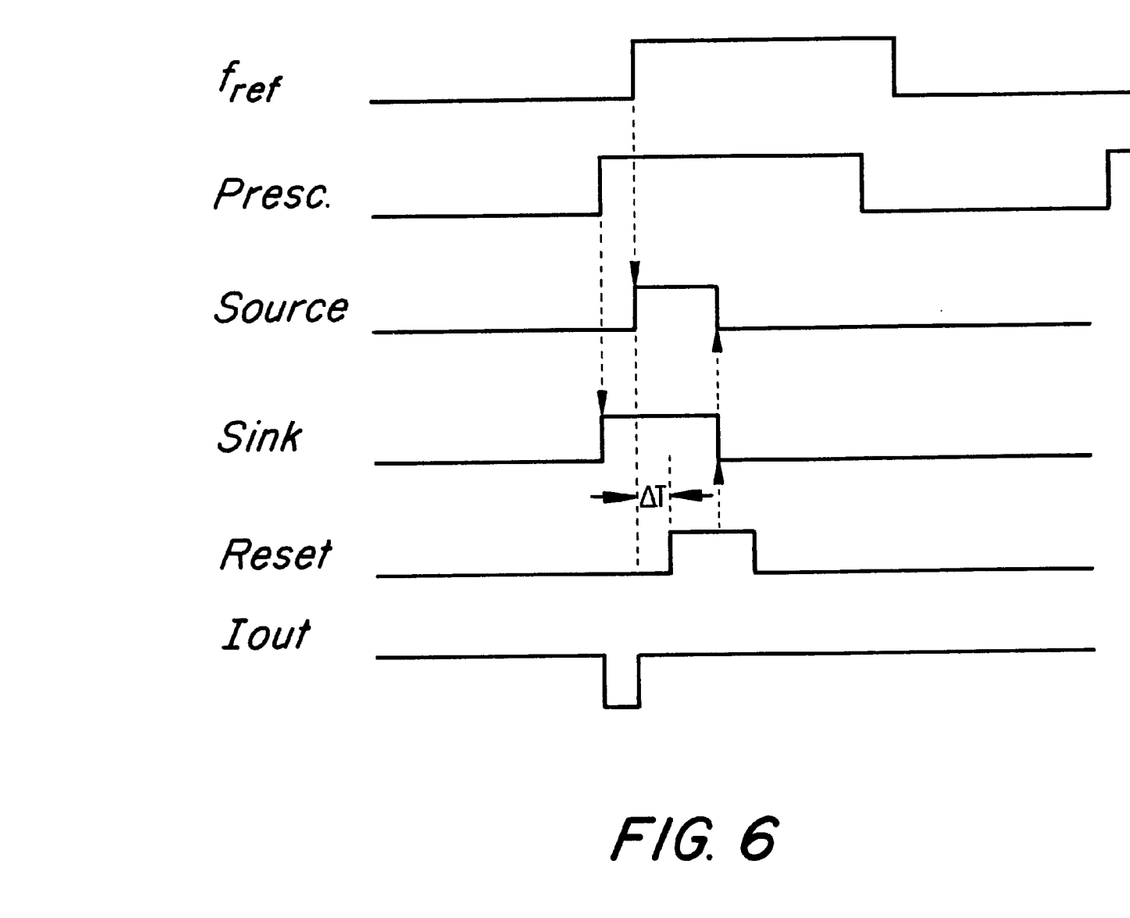
FIG. 6 is a timing diagram that illustrates typical phase-detector signals in a $\Sigma\Delta$ fractional-N PLL that employs a phase detector such as the one depicted in FIG. 4 when the prescaler division ratio has decreased from a nominal one.

FIG. 6 is a timing diagram that illustrates the phase-detector signals when the prescaler division ratio has decreased from the nominal one. The rising edges of the source and sink pulses are still relatively close to one another. However, note that in this case, the sink pulse is longer than the source pulse. As a consequence, a mismatch between the sink and source signals generates a nonlinear PLL transfer function. As used herein, the term "mismatch" is used to refer to the situation in which the respective amplitudes of the sink and source charge pump current sources are not the same. When this occurs, the charge inserted into the loop filter for a given positive phase difference between the signals at the input of the phase-detector is not the same as the charge inserted into the loop filter for an equal but negative phase difference between these signals. Hence, the nonlinear performance of the PLL.

There is therefore a need to provide methods and apparatuses for ensuring linear operation of PLLs.

SUMMARY

It should be emphasized that the terms "comprises" and "comprising", when used in this specification, are taken to specify the presence of stated features, integers, steps or components; but the use of these terms does not preclude the presence or addition of one or more other features, integers, steps, components or groups thereof.

In accordance with one aspect of the present invention, the foregoing and other objects are achieved in methods and apparatuses such as a phase detector that includes a first input that receives a first signal, a second input that receives a second signal, and a comparison circuit that generates an output current in proportion to a phase difference between the first signal and the second signal. An operating point circuit selectively maintains a first operating point of the phase detector when a phase of the first signal leads a phase of the second signal, and maintains a second operating point of the phase detector when the phase of the first signal lags the phase of the second signal. The first and second operating points are different from one another. Each of the first and second operating points causes the output current to vary substantially linearly for a predetermined range of both positive and negative phase differences between the first signal and the second signal.

Selective maintenance of the operating point may be done in any of a number of ways. For example, in some embodiments, either a constant sink current or a constant source current is alternatively added to the phase detector output current as a function of a direction of change in a frequency difference between the first signal and the second signal.

In other embodiments, selective maintenance of the operating point may be achieved within the phase detector by generating a source signal in response to an activating edge of the first signal, and generating a sink signal in response to an activating edge of the second signal. If the first signal leads the second signal, then a delayed source signal is generated, and both the source and sink signals are reset in response to assertion of both the delayed source signal and the sink signal. If the first signal lags the second signal, then a delayed sink signal is generated, and both the source and sink signals are reset in response to assertion of both the source signal and the delayed sink signal.

BRIEF DESCRIPTION OF THE DRAWINGS

The objects and advantages of the invention will be understood by reading the following detailed description in conjunction with the drawings in which.

DETAILED DESCRIPTION

The various features of the invention are described with reference to the figures, in which like parts are identified with the same reference characters.

The various aspects of the invention will now be described in detail in connection with a number of exemplary embodiments. To facilitate an understanding of the invention, many aspects of the invention are described in terms of sequences of actions to be performed by elements of a computer system. It will be recognized that in each of the embodiments, the various actions could be performed by specialized circuits (e.g., discrete logic gates interconnected to perform a specialized function), by program instructions being executed by one or more processors, or by a combination of both. Moreover, the invention can additionally be considered to be embodied entirely within any form of computer readable carrier, such as solid-state memory, magnetic disk, optical disk or carrier wave (such as radio frequency, audio frequency or optical frequency carrier waves) containing an appropriate set of computer instructions that would cause a processor to carry out the techniques described herein. Thus, the various aspects of the invention may be embodied in many different forms, and all such forms are contemplated to be within the scope of the invention. For each of the various aspects of the invention, any such form of embodiments may be referred to herein as "logic configured to" perform a described action, or alternatively as "logic that" performs a described action.

U.S. patent application Ser. No. 09/580,632, entitled "Linear Dead-Band-Free Digital Phase Detection", which is hereby incorporated herein by reference in its entirety, describes a solution to the problem of charge pump nonlinearity. In that application, it was explained how, even when the $\Sigma\Delta$-modulator noise is designed to fall outside the loop passband, a higher-than-expected PLL phase noise is obtained. It was further shown that this excess noise can be attributed to charge-pump asymmetry. In particular an examination of a typical phase-detector transfer function reveals that the rate of change in the average PLL output current ($I_{out\_avg}$) is different for positive phase differences than it is for negative phase differences. This asymmetry exists because a fraction of the $\Sigma\Delta$-modulator noise is rectified by the charge pump (i.e., an even-order nonlinearity). This nonlinear process centers the rectified $\Sigma\Delta$-modulator noise around DC (zero frequency) and at twice its bandwidth. Noise generated at frequencies that normally fall outside the loop bandwidth is folded back into the loop bandwidth due to rectification. This, in turn, modulates the VCO, thereby resulting in excess VCO phase noise. This rectification process has always been present in charge-pump-based phase detectors. It is, however, the use of $\Sigma\Delta$-modulators that aggravates this problem because $\Sigma\Delta$-modulators cause a much larger instantaneous phase error (since they shape the fractional-N spurious tones to contain more high-frequency components) than regular integer-N, or non-$\Sigma\Delta$-modulator fractional-N, loops. When the frequency synthesizer PLL is used to generate phase or frequency modulation, for example in a GSM transmitter, problems with the error-signal magnitude may be further aggravated.

The solution described in U.S. patent application Ser. No. 09/580,632 addresses the charge-pump asymmetry problem by including an operating point circuit that shifts the operating point of the phase-detector charge pumps so that, for a predefined range of both positive and negative phase differences, the charge-pump is kept operating in a linear region (i.e., the output current of the phase-detector charge pumps varies substantially linearly.

The operating point circuit may assume any of a number of alternative embodiments. For example, where the phase detector is employed in a phase-locked loop, whereby an output frequency of the phase-locked loop is a function of the output current of the phase detector, the operating point circuit may leak a predefined portion of the output current so as to prevent the leaked output current from influencing the output frequency of the phase-locked loop.

Alternatively, where the phase detector comprises a first circuit that asserts a first charge pump control signal in response to an edge of the first signal; a second circuit that asserts a second charge pump control signal in response to an edge of the second signal; a first charge pump that contributes a positive current to the output current in response to assertion of the first charge pump control signal; a second charge pump that contributes a negative current to the output current in response to assertion of the second charge pump control signal; and reset logic that supplies a reset signal to each of the first and second circuits in response to both of the first and second charge pump control signals being asserted, the operating point circuit may comprise delay logic that delays at least one of the first and second charge pump control signals from being supplied to the reset logic, wherein a length of time that it takes the first charge pump control signal to be supplied to the reset logic is not equal to the length of time that it takes the second charge pump control signal to be supplied to the reset logic. In this alternative, the delay logic may be designed to delay only one of the first and second charge pump control signals from being supplied to the reset logic. Alternatively, it may delay both the first and second charge pump control signals from being supplied to the reset logic.

In yet another alternative embodiment in which the phase detector is employed in a phase-locked loop, linear operation of the phase detector may be achieved by including, in the phase-locked loop one or more circuit elements that leak a predefined portion of at least one of a phase detector output current and a frequency control signal that controls a controllable oscillator circuit (e.g., a voltage controlled oscillator or current controlled oscillator) so as to prevent the leaked output current from influencing the output frequency of the phase-locked loop. For example, such leakage may be designed to be performed by one or more circuit elements in the loop filter that leak a predefined portion of the phase detector output current.

Figure 7:
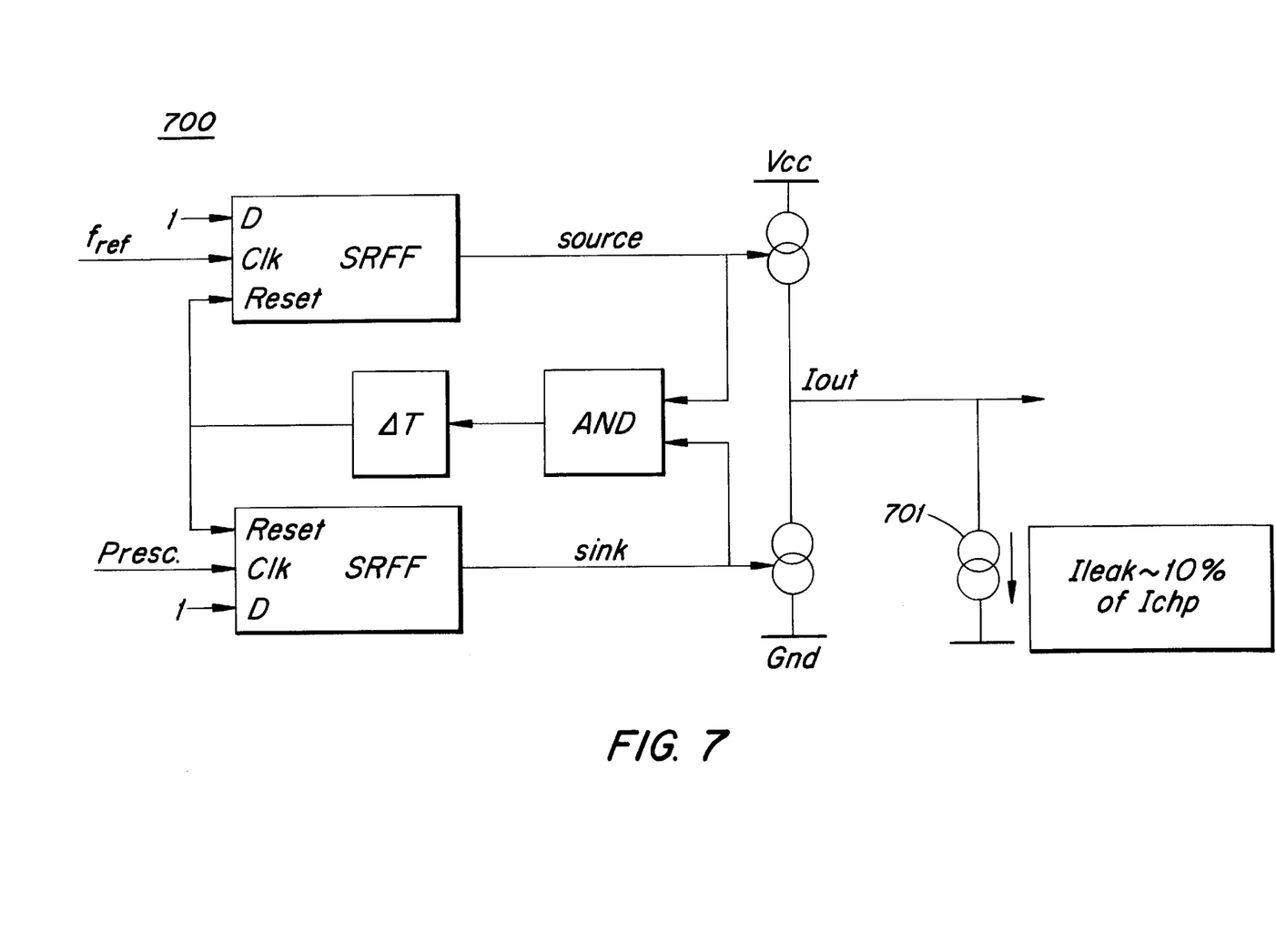
FIG. 7 is a block diagram of a phase-detector 700 that has been modified to include a constant sink current element 701 that draws a leakage current, $I_{leak}$, away from the output current, $I_{out}$, thereby preventing this much of the current from reaching the loop filter.

To illustrate the technique of adjusting the operating point of the phase detector charge pumps in order to achieve linear operation, FIG. 7 is a block diagram of a phase-detector 700 that has been modified to include a constant sink current element 701 that draws a leakage current, $I_{leak}$, away from the output current, $I_{out}$, thereby preventing this much of the current from reaching the loop filter. In an exemplary embodiment, the leakage current, $I_{leak}$, is approximately 10% of the nominal amplitude of the charge pump current sources ($I_{chp}$). More generally, the leakage current should be large enough so that when modulation is applied, the PLL will stay in its linear range.

Figure 8:
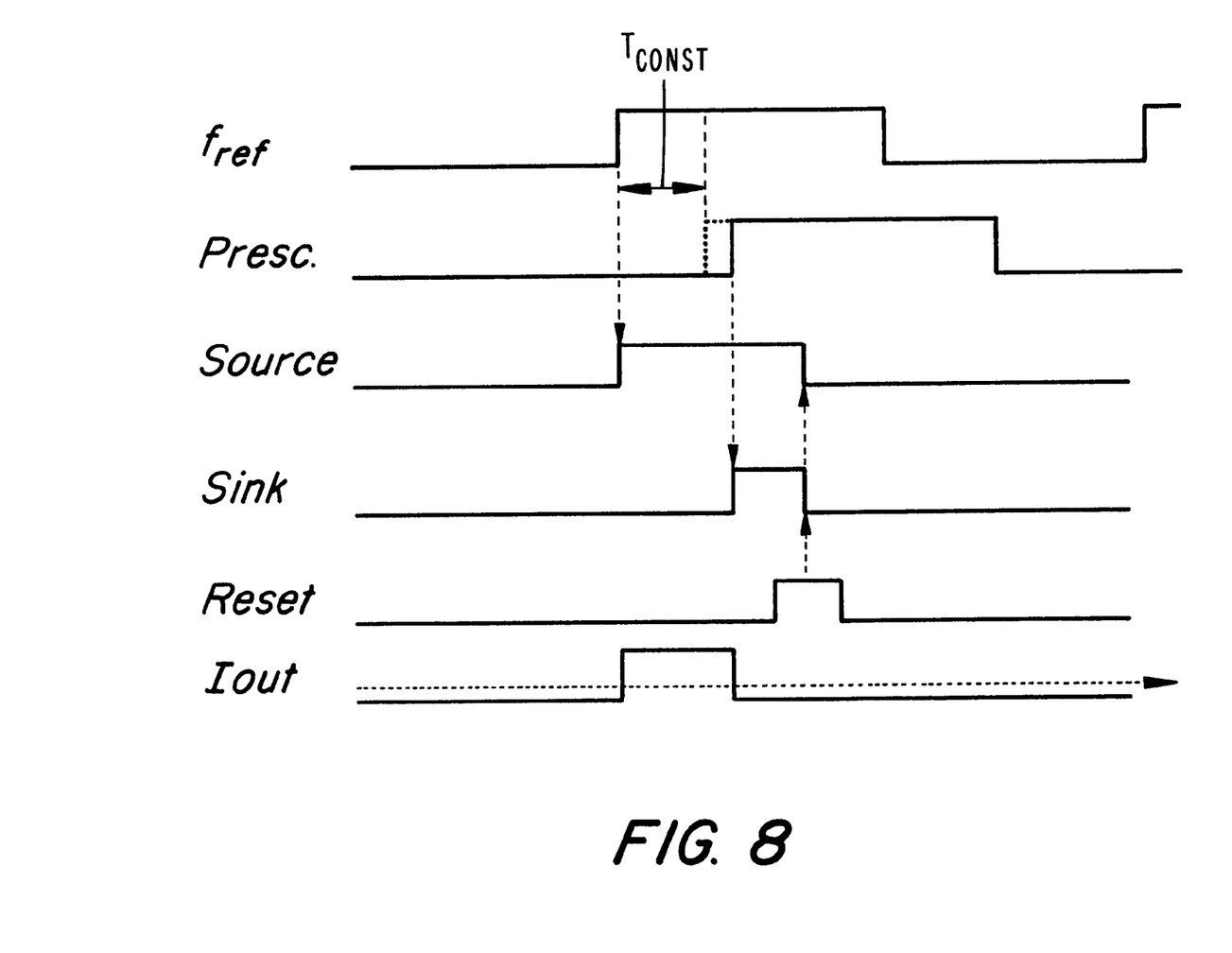
FIG. 8 is a timing diagram that illustrates signals that are generated in the phase-detector 700 when the prescaler division ratio is increased from a nominal one.

FIG. 8 is a timing diagram that illustrates signals that are generated in the phase-detector 700 when the prescaler division ratio is increased from a nominal one. As can be seen in the timing diagram, there is now a constant time difference, $T_{const}$, added to the relationship between the $f_{ref}$ signal and the prescaler input of the PLL to compensate for the applied leakage current.

Figure 9:
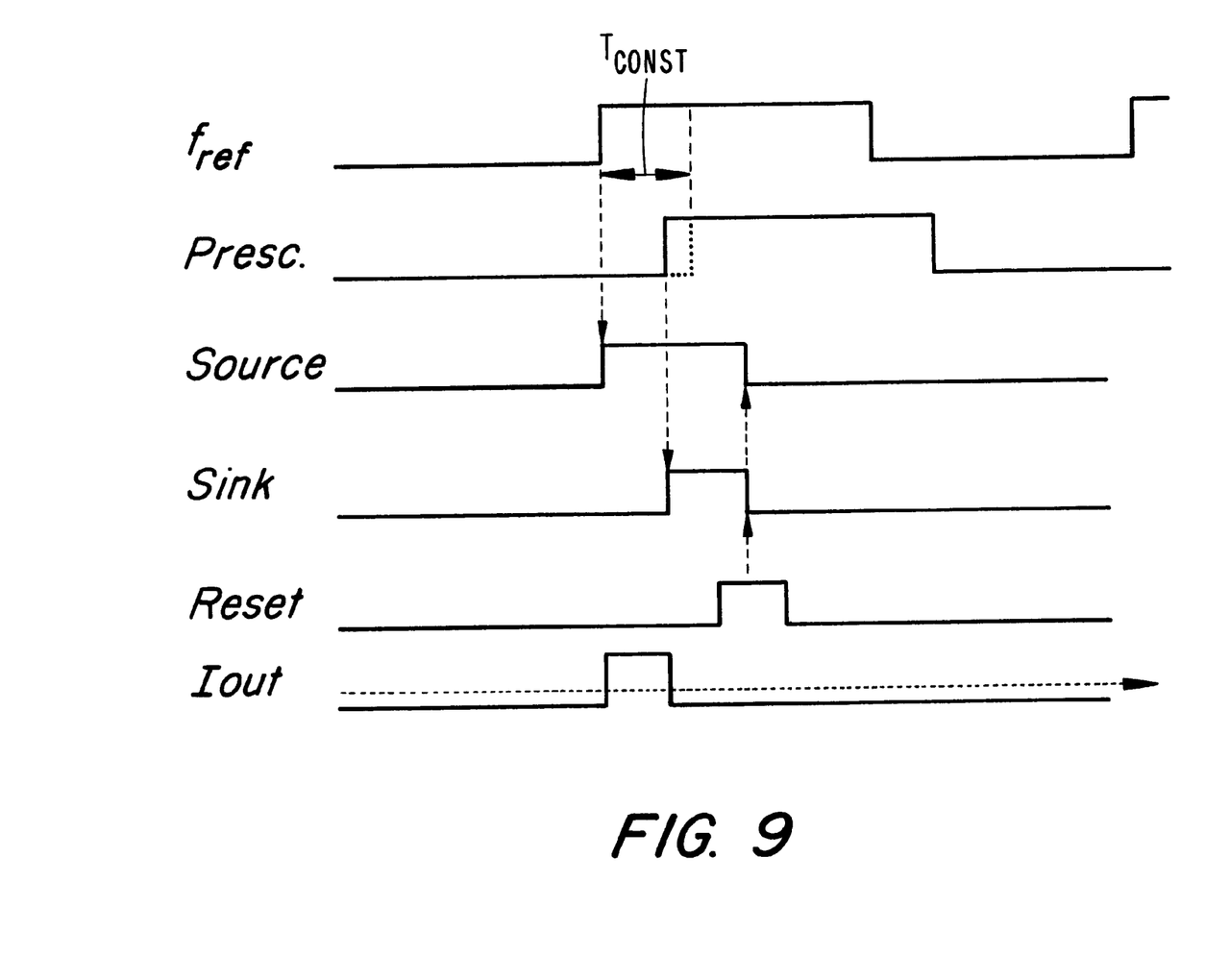
FIG. 9 is another timing diagram that illustrates the phase-detector signals generated in the phase-detector 700, this time when the prescaler division ratio has decreased from a nominal one.

FIG. 9 is another timing diagram that illustrates the phase-detector signals generated in the phase-detector 700, this time when the prescaler division ratio has decreased from a nominal one. The effect of the constant time difference, $T_{const}$, on the relationship between the $f_{ref}$ signal and the prescaler input of the PLL can be seen. In particular, even though the prescaler division ratio has decreased from a nominal one, the constant time difference, $T_{const}$, causes the $f_{ref}$ signal still to lead the prescaler input signal. This is to be compared with the operation of the phase-detector 400 (FIG. 4) that does not have a constant leakage current element—when the prescaler division ratio is decreased from a nominal one, the conventional effect is for the prescaler input signal to lead the $f_{ref}$ signal (and therefore, for the sink signal to lead the source signal) (see FIG. 6). As a result of the constant leakage current, and therefore of the constant time difference, $T_{const}$, the PLL transfer function is now set by the source current amplitude, independent of any mismatch between the sink and source current. Also, the rising edges of the sink and source current source are separated in time and are therefore insensitive to crosstalk.

This has been tested in a laboratory environment and has been found to solve all noise problems. The noise contribution from the longer charge pump pulses is negligible.

A drawback of this configuration is that the leakage current speeds up the lock-in time in one direction and slows it down in the other direction. If the leakage current were to be applied in the proper direction (i.e., applied in one direction if the loop voltage is to go up, and applied in the other direction if the loop voltage is to go down), then the lock-in time would always be reduced, and improved performance would be achieved. This is achieved in accordance with the following additional methods and apparatuses.

Figure 10:
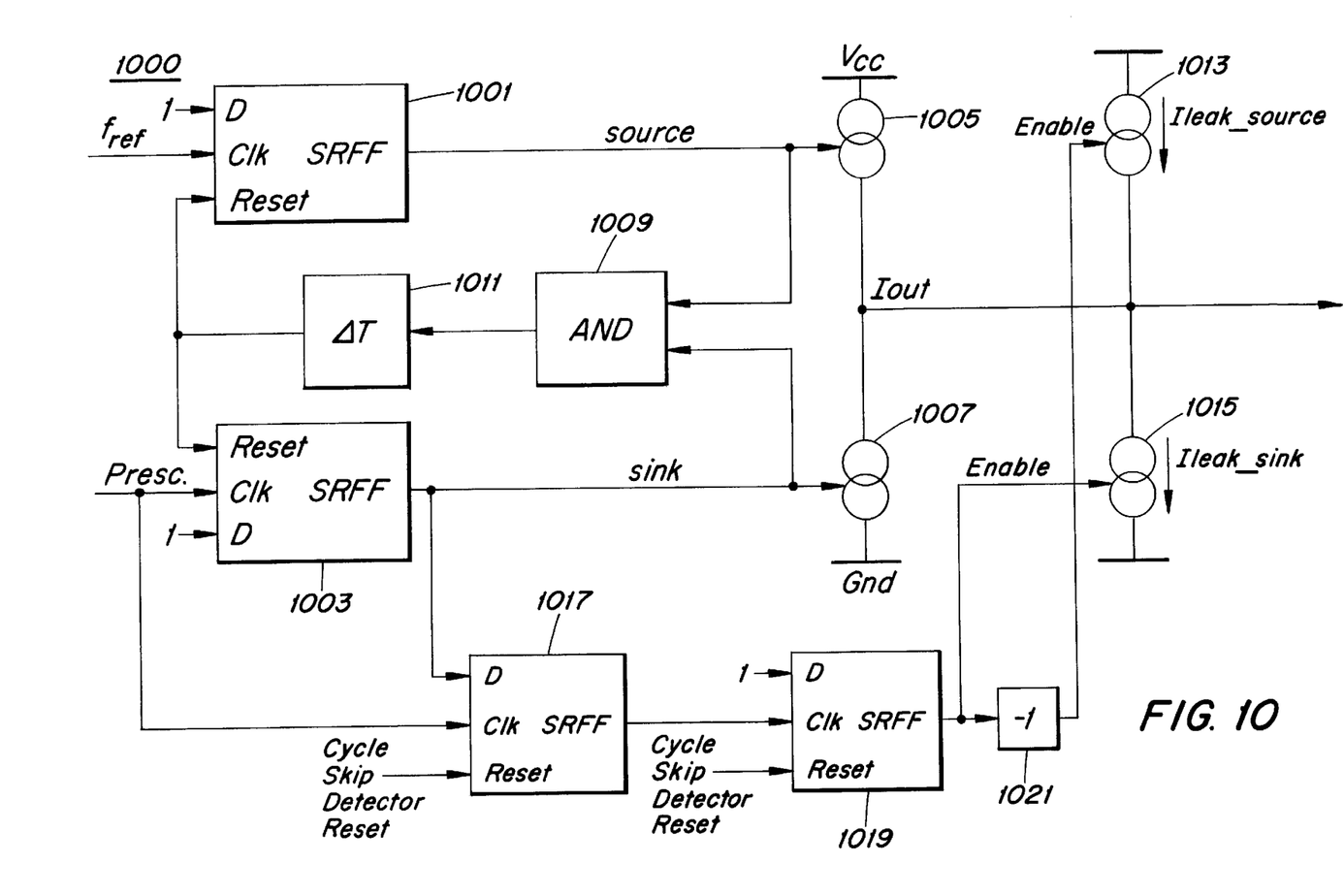
FIG. 10 is a block diagram of an exemplary embodiment of an improved phase detector 1000.

One embodiment of an improved phase detector 1000 is illustrated in the block diagram of FIG. 10. Here, first and second digital latches 1001, 1003 (each in the form of an SR-flip flop) are provided that enable multiple states and, hence, an extended range of the phase detector 1000. In operation, the first latch 1001 controls whether a first charge pump 1005 is on or off. Similarly, the second latch 1003 controls whether a second charge pump 1007 is on or off. The first and second charge pumps 1005, 1007 are connected in series, with the phase detector output current, $I_{out}$, being supplied at the connection point between the two charge pumps. The amount of phase detector output current, $I_{out}$, is related to whether none, one, or both of the first and second charge pumps 1005, 1007 are turned on. The amount of time that $I_{out}$ is non-zero is a function of the phase difference between the two input signals, $f_{ref}$ and Prescaler (Presc.). Each of these signals is supplied to a clock input of a respective one of the first and second latches 1001, 1003. The first of these signals to present a clocking edge causes the output of the corresponding latch to be asserted, which in turn, causes a corresponding one of the first and second charge pumps 1005, 1007 to turn on. When the clocking edge of the remaining input signal is subsequently asserted, it too causes the output of its corresponding latch to be asserted. The outputs of both the first and second latches 1001, 1003 are further supplied to respective inputs of a logical AND gate 1009, whose output is supplied to a delay circuit 1011, which delays the signal supplied at the output of the AND gate 1009 by a predetermined amount, ΔT. This delayed signal is then supplied to the RESET inputs of both the first and second latches 1001, 1003. Consequently, when the outputs of both latches 1001, 1003 are asserted, the output of the AND gate 1009 will be asserted as well, thereby resetting both latches 1001, 1003 after a delay of ΔT. They are now initialized to repeat the process again for a next cycle. As a result, the output current $I_{out}$ is either a positive value (being supplied by the first charge pump 1005) if the first input signal $f_{ref}$ leads the second input signal Presc., or else it is a negative value (being drawn by the second charge pump 1007) if the second input signal Presc. leads the first input signal $f_{ref}$.

In order to select a proper operating point to achieve improved performance, as described above, the phase detector 1000 further includes two leakage current elements in the form of a constant source current element 1013 and a constant sink current element 1015. The constant source current element 1013 is arranged to add an additional constant current to the output current $I_{out}$, and the constant sink current element 1015 is arranged to draw a constant current from the output current $I_{out}$. Each of the constant source and sink current elements 1013, 1015 is controllable (on or off), and control circuitry is provided so that only one of the constant source and sink current elements 1013, 1015 is enabled at any given time. In particular, the purpose of the control circuitry is to enable only one of the source and sink current elements 1013, 1015 based on whether the loop voltage of the PLL needs to increase or decrease in order to achieve a locked state.

To achieve this control in this exemplary embodiment, the control circuitry for the constant source and sink current elements 1013, 1015 comprises a third SR-flip flop 1017 connected to the sink-related circuit elements in a way that allows it to operate as a cycle skip detector (described in greater detail below), a fourth SR-flip flop 1019 to maintain the most-recent cycle skip detection status, and an invertor 1021 coupled to the output of the SR-flip flop 1019.

The purpose of the cycle skip detector is detect when two or more leading edges of the prescaler input signal have occurred without the occurrence of an intervening leading edge of the $f_{ref}$ signal. As a result, an input edge occurs before the phase detector SR-flip flops 1001, 1003 have been reset. The occurrence of a cycle skip indicates that the PLL has been forced to operate outside of its linear range; that is, the length of the current output pulse is no longer proportional to the input phase difference. It will be recognized that in alternative embodiments, the phase detector 1000 could be arranged to detect phase differences between trailing, rather than leading, edges of these input signals. Those of ordinary skill in the art will readily understand how to adjust the arrangement of the illustrated circuit components to operate in such other embodiments. For the remainder of this discussion, however, it will be assumed that the phase detector 1000 detects differences between leading edges of the $f_{ref}$ and prescaler input signals.

In order to detect the occurrence of cycle skips, the third SR-flip flop 1017 is arranged to receive the prescaler input signal at its clock input port, and to receive the output of the second latch 1003 at its data (D) input port. The reset input port of the third SR-flip flop 1017 is tied to a constant level (e.g., low) that prevents the third SR-flip flop 1017 from being reset. With this arrangement, so long as no cycle skips occur, the output of the second SR-flip flop 1003 will always be non-asserted (e.g., low) when the leading edge of the prescaler input signal occurs. This is because the $f_{ref}$ and prescaler input signals will, by definition, both be asserted before the occurrence of a next leading edge of the prescaler input signal. As explained above, the AND gate 1009 and delay circuit 1011 are arranged to reset both the first and second latches 1001, 1003 whenever both the $f_{ref}$ and prescaler input signals are asserted.

In the event that there is no intervening leading edge of the $f_{ref}$ signal between two successive leading edges of the prescaler input signal, the output of the second latch 1003 will remain high at the time that the second of the successive leading edges of the prescaler input signals occurs. This means that the third SR-flip flop 1017 will receive a logic high level (e.g., "1") at its D-input port when the second leading edge of the prescaler input signal is supplied to its clock input port. As a result, the output of the third SR-flip flop 1017 is asserted (e.g., it goes to a logic high level—for example, "1"), thereby indicating the occurrence of a cycle skip. The assertion of the output signal from the third SR-flip flop 1017 in turn causes the logic high level supplied at the D-input port of the fourth SR-flip flop 1019 to be clocked to the output port of the fourth SR-flip flop 1019.

The output signal from the fourth SR-flip flop 1019 is supplied to a control input port of one of the constant source and sink current elements 1013, 1015—in this example, it is supplied to the control input port of the constant source current element 1013. The output signal from the fourth SR-flip flop 1019 is also supplied to an invertor 1021, whose output signal is supplied to a control input port of the other one of the constant source and sink current elements 1013, 1015—in this example, it is supplied to the control input port of the constant sink current element 1015. In this way, the constant source and sink current elements 1013, 1015 always receive control signals of opposite polarity, thereby ensuring that only one of them is active at any given time.

The reason why the control signals for the source and sink current elements 1013, 1015 is derived from the fourth SR-flip flop 1019 rather than from the third SR-flip flop 1017 is that the fourth SR-flip flop 1019 is able to remember, for at least the duration of the PLL lock-in period, the fact that a cycle skip has occurred. By contrast, the output from the third SR-flip flop 1017 will be reset as soon as the next non-cycle skip event occurs (i.e., as soon as the PLL has returned to linear operation).

The exemplary control logic for the constant source and sink current elements 1013, 1015 is designed with the following in mind: Since the loop filter is discharged by parasitics to ground, the most likely starting point of the loop voltage is at a low voltage. Therefore, to start with, the leakage current is sourced into the loop filter. This is achieved by initially asserting the "cycle skip detector reset" signal that as supplied to a "Reset" input of each of the third and fourth SR-flip flops 1017, 1019. This initializing of the third and fourth SR-flip flops 1017, 1019 should be performed when it is known that the PLL will need to lock onto another frequency, such as occurs in GSM's TDMA mode for every RX or TX-slot. Then the cycle skip detector is used in the phase detector 1000 to determine whether a cycle skip has occurred on the downside of the phase detector 1000. If this happens, the polarity of the leakage current is changed to speed up the lock-in time in the proper direction. Since the third and fourth SR-flip flops 1017, 1019 will not be reset again until a new frequency needs to be locked onto, the change in polarity of the leakage current will continue so long as the desired operating frequency of the PLL does not change.

By using this configuration, the lock-in time of the PLL is sped up while, at the same time, the PLL is linearized.

Figure 11:
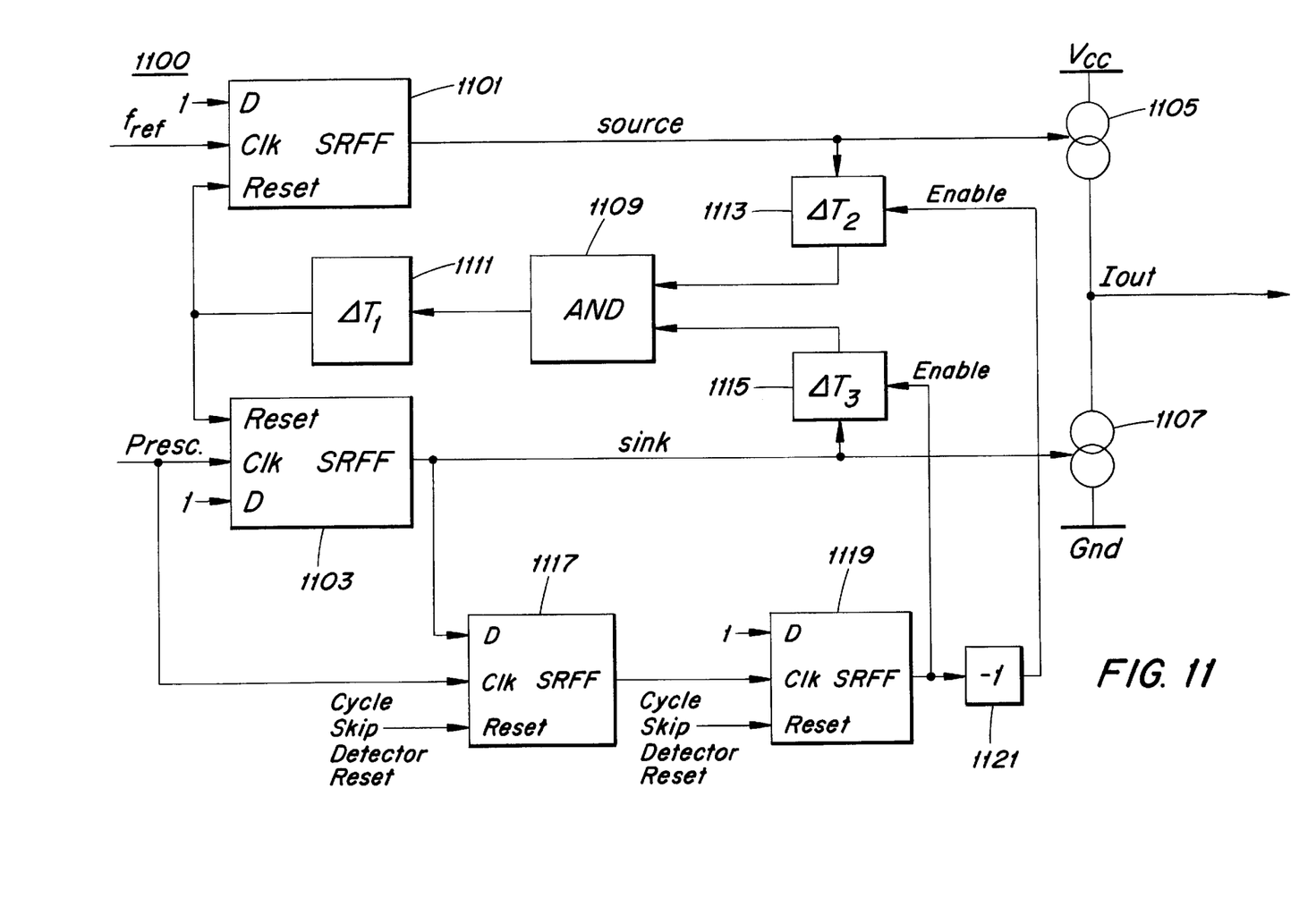
FIG. 11 is a block diagram of another exemplary embodiment of an improved phase detector 1100.

Another embodiment of an improved phase detector 1100 is illustrated in the block diagram of FIG. 11. As in the earlier-described embodiment, first and second digital latches 1101, 1103 (each in the form of an SR-flip flop) are provided that enable multiple states and, hence, an extended range of the phase detector 1100. In operation, the first latch 1101 controls whether a first charge pump 1105 is on or off. Similarly, the second latch 1003 controls whether a second charge pump 1107 is on or off. The first and second charge pumps 1105, 1107 are connected in series, with the phase detector output current, $I_{out}$, being supplied at the connection point between the two charge pumps. The amount of phase detector output current, $I_{out}$, is related to whether none, one, or both of the first and second charge pumps 1105, 1107 are turned on. The amount of time that $I_{out}$ is non-zero is a function of the phase difference between the two input signals, $f_{ref}$ and Prescaler (Presc.). Each of these signals is supplied to a clock input of a respective one of the first and second latches 1101, 1103. The first of these signals to present a clocking edge causes the output of the corresponding latch to be asserted, which in turn, causes a corresponding one of the first and second charge pumps 1105, 1107 to turn on. When the clocking edge of the remaining input signal is subsequently asserted, it too causes the output of its corresponding latch to be asserted.

As with earlier-described embodiments, resetting the first and second latches 1101, 1103 is performed in response to the output signals from both latches (i.e., the "source" and "sink" signals) being asserted. For this purpose, an AND gate 1109 is provided to detect simultaneous assertion of the "source" and "sink" signals, and a first delay element 1111 is provided to delay the output signal from the AND gate 1109 by a constant amount, $\Delta T_1$, in order to eliminate the dead-zone in the phase detector operation. However, in this embodiment the setting of the operating point to achieve linear operation is performed by additionally delaying one of the "source" and "sink" signals prior to its being supplied to a respective one of the inputs of the AND gate 1109. This technique is described in the above-referenced U.S. patent application Ser. No. 09/580,632.

If the same one of the "source" and "sink" signals were always delayed prior to being supplied to the AND gate 1109 (or if different delay amounts were always applied to each of the "source" and "sink" signals), linear operation of the phase detector 1100 would be achieved, but the lock-in time of the PLL would be sped up in one direction and slowed down in another. To address this problem, a second delay element 1113 is interposed between the "source" signal and a first input port of the AND gate 1109, and a third delay element 1115 is interposed between the "sink" signal and a second input port of the AND gate 1109. Each of the second and third delay elements 1113, 1115 is controllable, so that the delay may or may not be applied to the input signal as a function of a supplied control signal. The second delay element 1113, when enabled, delays the "source" signal by a predetermined amount, $\Delta T_2$, and the third delay element 1115, when enabled, delays the "sink" signal by a predetermined amount, $\Delta T_3$. The predetermined delay amounts, $\Delta T_1$, $\Delta T_2$ and $\Delta T_3$ are implementation-dependent, and any two or more of them may or may not be equal to one another.

In order to achieve a proper operating point for linear operation, additional control logic is included that controls the second and third delay elements 1113, 1115 such that only one of them is enabled at any given time. In particular, the control logic enables that one of the second and third delay elements 1113, 1115 that will speed up the lock-in time of the PLL. This selection is based on whether the loop voltage of the PLL needs to increase or decrease in order to achieve a locked state.

In order to achieve this control in this exemplary embodiment, the control logic for the second and third delay elements 1113, 1115 comprises a third SR-flip flop 1117 connected to the sink-related circuit elements in a way that allows it to operate as a cycle skip detector (as described above), a fourth SR-flip flop 1119 to maintain the most-recent cycle skip detection status, and an invertor 1121 coupled to the output of the SR-flip flop 1119.

More particularly, in order to detect the occurrence of cycle skips, the third SR-flip flop 1117 is arranged to receive the prescaler input signal at its clock input port, and to receive the output of the second latch 1103 at its data (D) input port. The reset input port of the third SR-flip flop 1117 is tied to a constant level (e.g., low) that prevents the third SR-flip flop 1117 from being reset. With this arrangement, so long as no cycle skips occur, the output of the second SR-flip flop 1103 will always be non-asserted (e.g., low) when the leading edge of the prescaler input signal occurs. The output of the second SR-flip flop 1103 is asserted (e.g., to a high logic level) when a cycle skip occurs. The operation of this cycle skip detector arrangement is the same as that described above with respect to FIG. 10, and will therefore not be repeated here.

When the output of the third SR-flip flop 1117 is asserted (e.g., when it goes to a logic high level—for example, "1"), the occurrence of a cycle skip is indicated. The assertion of the output signal from the third SR-flip flop 1117 in turn causes the logic high level supplied at the D-input port of the fourth SR-flip flop 1119 to be clocked to the output port of the fourth SR-flip flop 1119.

The output signal from the fourth SR-flip flop 1119 is supplied to a control input port of one of the second and third delay elements 1113, 1115—in this example, it is supplied to the control input port of the third delay element 1115. The output signal from the fourth SR-flip flop 1119 is also supplied to an invertor 1121, whose output signal is supplied to a control input port of the other one of the second and third delay elements 1113, 1115—in this example, it is supplied to the control input port of the second delay element 1113. In this way, the second and third delay elements 1013, 1015 always receive control signals of opposite polarity, thereby ensuring that only one of them is active at any given time.

With the above-described arrangement, when the outputs of both latches 1101, 1103 are asserted, the output of the AND gate 1109 will be asserted after some delay ($\Delta T_2$ or $\Delta T_3$), which in turn will reset both latches 1101, 1103 after an additional delay of $\Delta T_1$. They are now initialized to repeat the process again for a next cycle. As a result, the output current $I_{out}$ is either a positive value (being supplied by the first charge pump 1105) if the first input signal $f_{ref}$ leads the second input signal Presc., or else it is a negative value (being drawn by the second charge pump 1107) if the second input signal Presc. leads the first input signal $f_{ref}$.

The reason why the control signals for the second and third delay elements 1113, 1115 is derived from the fourth SR-flip flop 1119 rather than from the third SR-flip flop 1117 is that the fourth SR-flip flop 1119 is able to remember, for at least the duration of the PLL lock-in period, the fact that a cycle skip has occurred. By contrast, the output from the third SR-flip flop 1117 will be reset as soon as the next non-cycle skip event occurs (i.e., as soon as the PLL has returned to linear operation).

The exemplary control logic for the second and third delay elements 1113, 1115 is designed with the following in mind: Since the loop filter is discharged by parasitics to ground, the most likely starting point of the loop voltage is at a low voltage (i.e., it is most likely that, initially, the PLL output will have to increase in frequency). This is achieved by initially asserting the "cycle skip detector reset" signal that as supplied to a "Reset" input of each of the third and fourth SR-flip flops 1117, 1119. This initializing of the third and fourth SR-flip flops 1117, 1119 should be performed when it is known that the PLL will need to lock onto another frequency, such as occurs in GSM's TDMA mode for every RX or TX-slot. Therefore, to start with, the additional delay in the reset path is applied to the "source" signal. Then the cycle skip detector is used in the phase detector 1100 to determine whether a cycle skip has occurred on the downside of the phase detector 1100. If this happens, the additional delay in the reset path is switched from the "source" signal to the "sink" signal in order to speed up the lock-in time in the proper direction.

By using this configuration, the degradation in lock-in time of the PLL that would otherwise be caused by the additional delay is avoided, while, at the same time, the PLL is linearized.

The invention has been described with reference to a particular embodiment. However, it will be readily apparent to those skilled in the art that it is possible to embody the invention in specific forms other than those of the preferred embodiment described above. This may be done without departing from the spirit of the invention. The preferred embodiment is merely illustrative and should not be considered restrictive in anyway. The scope of the invention is given by the appended claims, rather than the preceding description, and all variations and equivalents which fall within the range of the claims are intended to be embraced therein.

What is claimed is:

1. A phase locked loop comprising:
    a phase detector that comprises:
        a first input that receives a reference signal;
        a second input that receives a feedback signal; and
        a comparison circuit that generates a phase detector output current in proportion to a phase difference between the reference signal and the feedback signal;
    a loop filter that generates a frequency control signal from the phase detector output current;
    a circuit that generates a phase-locked loop output signal that has a frequency that is controlled by the frequency control signal;
    a frequency divider that generates the feedback signal from the phase-locked loop output signal; and
    an operating point circuit that selectively maintains a first operating point of the phase detector when a phase of the reference signal leads a phase of the feedback signal, and maintains a second operating point of the phase detector when the phase of the reference signal lags the phase of the feedback signal,
    wherein the operating point circuit comprises a circuit that alternatively adds either a constant sink current or a constant source current to the phase detector output current as a function of a direction of change in a frequency difference between the first signal and the second signal,
    wherein the first and second operating points are different from one another, and
    wherein each of the first and second operating points causes the phase detector output current to vary substantially linearly for a predetermined range of both positive and negative phase differences between the reference signal and the feedback signal.

2. The phase locked loop of claim 1, wherein the frequency divider is a fractional-N frequency divider.

3. A method of generating a phase-locked loop output signal, comprising:
    generating a phase detector output current in proportion to a phase difference between a reference clock signal and a feedback signal;
    selectively adjusting the phase detector output current by a first amount when a phase of the reference signal leads a phase of the feedback signal, and adjusting the output current by a second amount when the phase of the reference signal lags the phase of the feedback signal;
    generating a frequency control signal from the adjusted phase detector output current;
    generating the phase-locked loop output signal that has a frequency that is controlled by the frequency control signal;
    using a frequency divider to generate the feedback signal from the phase-locked loop output signal,
    wherein each of the first and second amounts cause the phase detector output current to vary substantially linearly for a predetermined range of both positive and negative phase differences between the reference signal and the feedback signal, and wherein:
        adjusting the phase detector output current by the first amount when the phase of the reference signal leads the phase of the feedback signal comprises adding a constant source current to the phase detector output current when the phase of the reference signal leads the phase of the feedback signal; and
        adjusting the phase detector output current by the second amount when the phase of the reference signal lags the phase of the feedback signal comprises adding a constant sink current to the phase detector output current when the phase of the reference signal lags the phase of the feedback signal.

4. The method of claim 3, wherein using the frequency divider to generate the feedback signal from the phase-locked loop output signal comprises using a fractional-N frequency divider to generate the feedback signal from the phase-locked loop output signal.

* * * * *